United States Patent
Iwano et al.

(10) Patent No.: US 11,710,643 B2
(45) Date of Patent: Jul. 25, 2023

(54) METHOD OF ETCHING AND PLASMA PROCESSING APPARATUS

(71) Applicant: Tokyo Electron Limited, Tokyo (JP)

(72) Inventors: Mitsuhiro Iwano, Miyagi (JP); Masanori Hosoya, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 320 days.

(21) Appl. No.: 17/270,499

(22) PCT Filed: Aug. 13, 2019

(86) PCT No.: PCT/JP2019/031859
§ 371 (c)(1),
(2) Date: Feb. 23, 2021

(87) PCT Pub. No.: WO2020/040005
PCT Pub. Date: Feb. 27, 2020

(65) Prior Publication Data
US 2021/0335623 A1 Oct. 28, 2021

(30) Foreign Application Priority Data
Aug. 24, 2018 (JP) .................. 2018-157570

(51) Int. Cl.
*H01L 21/311* (2006.01)
*H01J 37/32* (2006.01)

(52) U.S. Cl.
CPC .... *H01L 21/31116* (2013.01); *H01J 37/3266* (2013.01); *H01J 37/32449* (2013.01); *H01J 2237/332* (2013.01); *H01J 2237/334* (2013.01)

(58) Field of Classification Search
None
See application file for complete search history.

(56) References Cited

U.S. PATENT DOCUMENTS

2010/0028563 A1* 2/2010 Ota .................. C23C 16/503
427/580

FOREIGN PATENT DOCUMENTS

| JP | H09-270416 A | 10/1997 |
|---|---|---|
| JP | 2001-053061 A | 2/2001 |
| JP | 2007-284794 A | 11/2007 |
| JP | 2013-004679 A | 1/2013 |
| JP | 2016-136606 A | 7/2016 |
| JP | 2017-216284 A | 12/2017 |
| JP | 2018-032720 A | 3/2018 |

OTHER PUBLICATIONS

International Search Report for PCT/JP2019/031859 dated Oct. 29, 2019.

* cited by examiner

*Primary Examiner* — Roberts P Culbert
(74) *Attorney, Agent, or Firm* — Pearne & Gordon LLP

(57) ABSTRACT

A method includes etching a first region by plasma etching such that an upper surface of the first region is provided at a deeper position within a substrate than a second region; forming a deposit containing carbon on the substrate by forming plasma of a hydrocarbon gas inside a chamber of a plasma processing apparatus; and further etching the first region by plasma etching. In the forming of the plasma of the hydrocarbon gas, magnetic field distribution in which a horizontal component on an edge side of the substrate is larger than a horizontal component on a center of the substrate is formed by an electromagnet.

13 Claims, 16 Drawing Sheets ions of a rare gas are supplied to the substrate. To generate the ions of the rare gas, plasma of the rare gas is formed inside the chamber. When the rare gas ions are supplied to the substrate, the fluorocarbon in the deposit reacts with the silicon oxide in the first region. As a result, the first region is etched. Meanwhile, the second region is protected by the deposit.

Patent Document 1: Japanese Patent Laid-open Publication No. 2016-136606

SUMMARY

In one exemplary embodiment, there is provided a method of selectively etching a first region of a substrate with respect to a second region of the substrate formed of a different material from the first region. The method includes etching the first region by plasma etching such that an upper surface of the first region is provided at a deeper position within the substrate than the second region; forming, after the etching of the first region, a deposit containing carbon on the substrate by forming plasma of a hydrocarbon gas inside a chamber of a plasma processing apparatus in which the substrate is placed; and further etching, after the forming of the plasma of the hydrocarbon gas, the first region by plasma etching. In the forming of the deposit, magnetic field distribution in which a horizontal component on an edge side of the substrate is larger than a horizontal component on a center of the substrate is formed by an electromagnet.

DETAILED DESCRIPTION

Figure 1:
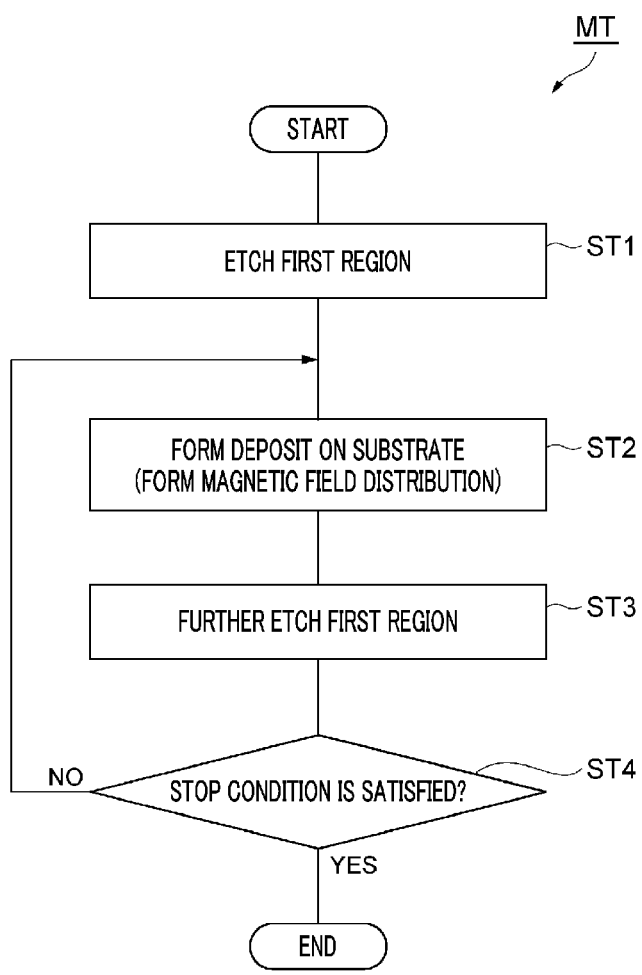
FIG. 1 is a flowchart illustrating a method of etching according to an exemplary embodiment.

Hereinafter, various exemplary embodiments will be described.

In one exemplary embodiment, there is provided a method of selectively etching a first region of a substrate with respect to a second region of the substrate formed of a different material from the first region. The method includes etching the first region by plasma etching such that an upper surface of the first region is provided at a deeper position within the substrate than the second region. The method further includes forming, after the etching of the first region, a deposit containing carbon on the substrate by forming plasma of a hydrocarbon gas inside a chamber of a plasma processing apparatus in which the substrate is placed. The method further includes further etching, after the forming of the plasma of the hydrocarbon gas, the first region by plasma etching. In the forming of the deposit, magnetic field distribution in which a horizontal component on an edge side of the substrate is larger than a horizontal component on a center of the substrate is formed by an electromagnet.

In the method according to the above-described exemplary embodiment, the deposit is formed of carbon species from plasma of a hydrocarbon gas. Further, since the first region extends from a deeper position within the substrate than the second region, the thickness of the deposit is large on the second region and small on the first region. While the second region is protected by the deposit, the first region is further etched. Therefore, the etching selectivity of the first region of the substrate with respect to the second region of the substrate is increased. Also, while the plasma of the hydrocarbon gas is formed, the magnetic field distribution in which the horizontal component present on the edge side of the substrate is larger than the horizontal component on the center of the substrate is formed by the electromagnet. Therefore, the density of the plasma on the edge side of the substrate is increased. As a result, the density of the plasma in a diametrical direction becomes uniform in distribution. Since carbon species from the plasma with such density distribution are deposited on the substrate, the in-plane uniformity in the thickness of the deposit is improved. Therefore, the in-plane uniformity in selective etching of the first region of the substrate with respect to the second region of the substrate is improved.

In the exemplary embodiment, the first region may be formed of a silicon-containing material.

In the exemplary embodiment, the second region may be formed of a metal-containing material.

In the exemplary embodiment, the first region may be formed of silicon oxide, and the second region may be formed of silicon nitride.

In the etching of the first region, plasma of a processing gas containing a fluorocarbon gas may be formed inside the chamber in which the substrate is placed.

In the further etching of the first region, the plasma of the processing gas containing the fluorocarbon gas is formed inside the chamber in which the substrate is placed.

In the exemplary embodiment, at least one of the etching of the first region or the further etching of the first region may include: forming plasma of a processing gas containing a fluorocarbon gas inside the chamber in which the substrate is placed to form a deposit containing fluorocarbon on the substrate; and forming plasma of a rare gas inside the chamber to etch the first region by supplying rare gas ions to the substrate to allow the fluorocarbon in the deposit formed on the substrate to react with the silicon-containing material.

In the exemplary embodiment, the forming of the deposit and the further etching of the first region may be repeated alternately.

In another exemplary embodiment, there is provided a plasma processing apparatus configured to selectively etch a first region of a substrate with respect to a second region of the substrate formed of a different material from the first region. The plasma processing apparatus includes a chamber, a substrate supporting table, a gas supply, a high frequency power supply, an electromagnet, a driving power supply and a controller. The substrate supporting table has a lower electrode, and is provided inside the chamber. The gas supply is configured to supply a gas into the chamber. The high frequency power supply is configured to generate a high frequency power to excite the gas inside the chamber into plasma. The electromagnet is configured to form a magnetic field in an internal space of the chamber. The driving power supply is configured to supply a current to the electromagnet. The controller is configured to control the gas supply, the high frequency power supply and the driving power supply. The controller is configured to perform a first control, a second control and a third control. The first control includes controlling the gas supply and the high frequency power supply to etch the first region by plasma etching such that an upper surface of the first region is provided at a deeper position within the substrate than the second region. The second control includes controlling the gas supply and the high frequency power supply to form plasma of a hydrocarbon gas in order to form a deposit containing carbon on the second region after the first region is etched. The third control includes controlling the gas supply and the high frequency power supply to further etch the first region by plasma etching after the deposit is formed on the second region. The second control includes controlling the driving power supply to form magnetic field distribution, in which a horizontal component on an edge side of the substrate is larger than a horizontal component on a center of the substrate, by the electromagnet while the plasma of the hydrocarbon gas is being formed.

In the another exemplary embodiment, the first region may be formed of a silicon-containing material. The first control may include controlling the gas supply and the high frequency power supply to form plasma of a processing gas containing a fluorocarbon gas inside the chamber. The third control may include controlling the gas supply and the high frequency power supply to form the plasma of the processing gas containing the fluorocarbon gas inside the chamber.

In the another exemplary embodiment, the first region may be formed of a silicon-containing material. At least one of the first control or the third control may include: controlling the gas supply and the high frequency power supply to form plasma of a processing gas containing a fluorocarbon gas inside the chamber in order to form a deposit containing fluorocarbon on the substrate; and controlling the gas supply and the high frequency power supply to form plasma of a rare gas inside the chamber in order to etch the first region by supplying rare gas ions to the substrate to allow the fluorocarbon in the deposit formed on the substrate to react with the silicon-containing material.

In the another exemplary embodiment, the controller may alternately repeat the second control and the third control.

Hereinafter, various exemplary embodiments of the present disclosure will be explained with reference to the accompanying drawings. Further, in the drawings, similar symbols typically identify similar components unless context dictates otherwise.

FIG. 1 is a flowchart illustrating a method of etching according to an exemplary embodiment. A method of etching according to an exemplary embodiment (hereinafter, referred to as "method MT") is performed to selectively etch a first region of a substrate with respect to a second region thereof.

Figure 2:
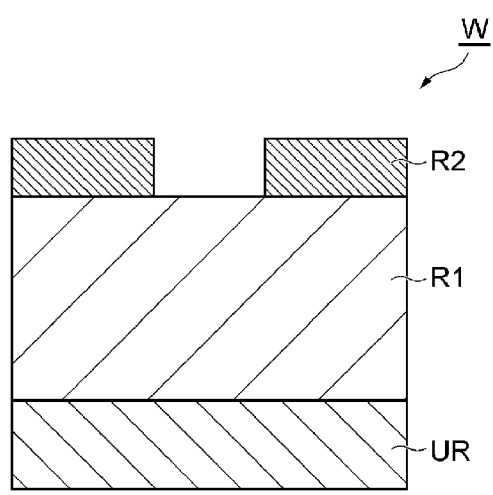
FIG. 2 is a partial cross-sectional view of an example substrate.

FIG. 2 is a partial cross-sectional view of an example substrate. An example substrate W shown in FIG. 2 can be processed by the method MT. The substrate W may have a disk shape like a wafer. The substrate W has a first region R1 and a second region R2. The substrate W may further have an underlying region UR. The first region R1 and the second region R2 are provided on the underlying region UR. In the exemplary embodiment, the first region R1 is provided on the underlying region UR, and the second region R2 is provided on the first region R1. The second region R2 is patterned like a mask. That is, the second region R2 provides an opening. In another exemplary embodiment, the first region R1 may be formed to fill a recess provided by the second region R2. Further, the first region R1 may be formed so as to cover the second region.

The first region R1 is a region to be selectively etched. The second region R2 is formed of a different material from the first region R1. The material of the first region R1 and the material of the second region R2 are not limited. The first region R1 is formed of, for example, a silicon-containing material. The silicon-containing material of the first region R1 is, for example, $SiO_2$. The silicon-containing material of the first region R1 may be a low dielectric constant material. The low dielectric constant material is, for example, SiOC or SiOCH.

The second region R2 is formed of, for example, a metal-containing material. The metal-containing material is, for example, any one metal material of titanium, tungsten, zirconium, aluminum, tantalum, cobalt or ruthenium, or an oxide, nitride or carbide of the corresponding metal material. The second region R2 may be formed of silicon nitride.

Figure 3:
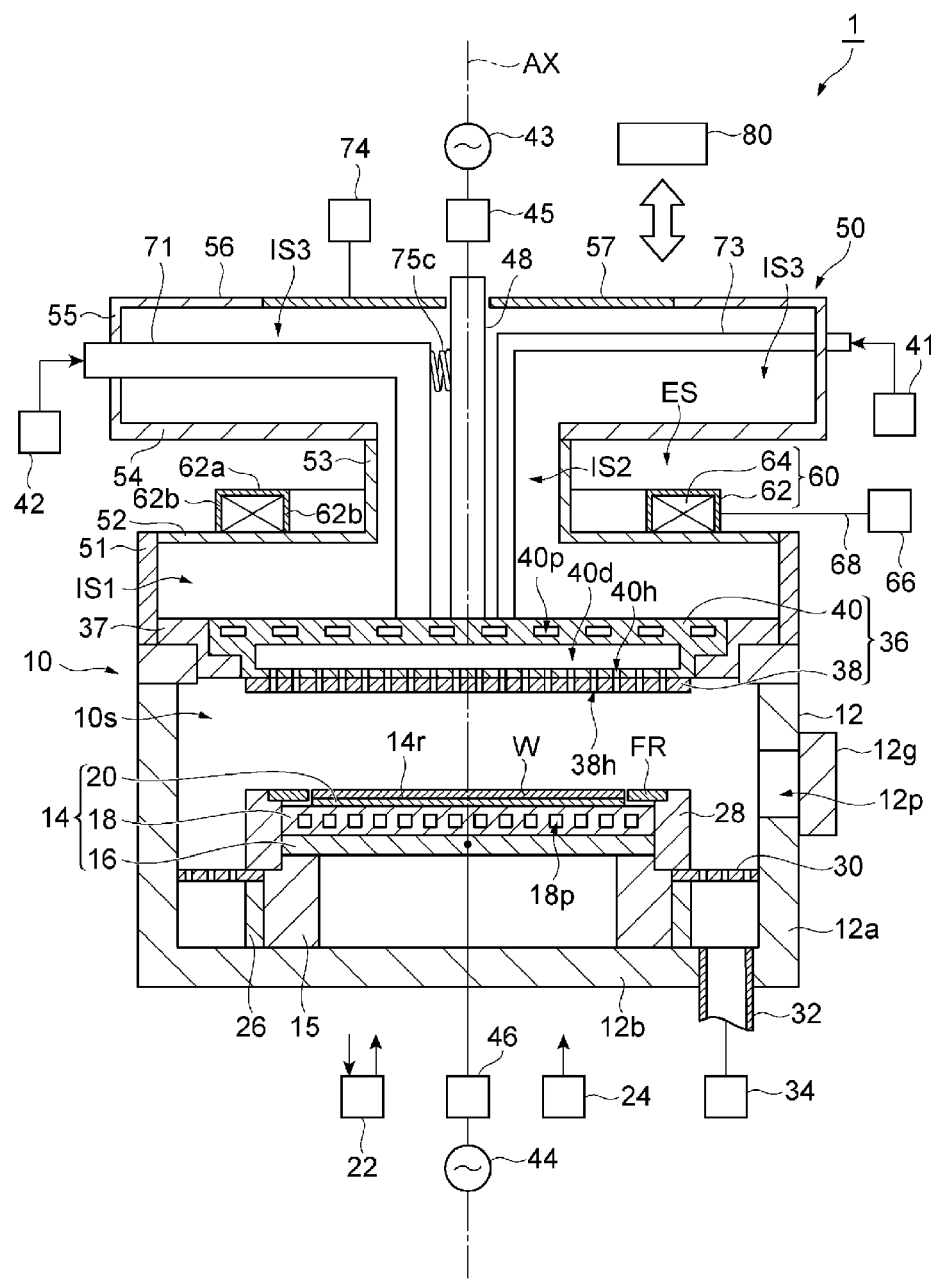
FIG. 3 schematically illustrates a plasma processing apparatus according to the exemplary embodiment.

The method MT is performed in a state where a substrate is placed in a chamber of a plasma processing apparatus. FIG. 3 schematically illustrates a plasma processing apparatus according to the exemplary embodiment. A plasma processing apparatus 1 shown in FIG. 3 includes a chamber 10. The chamber 10 is a container having therein an internal space 10s. The chamber 10 has a substantially cylindrical shape. A central axis AX shown in FIG. 3 is a central axis of the chamber 10 and the internal space 10s.

The chamber 10 has a chamber main body 12. The chamber main body 12 has a substantially cylindrical shape. The internal space 10s of the chamber 10 is provided inside the chamber main body 12. The chamber main body 12 includes a side wall 12a and a bottom 12b. The side wall 12a serves as a side wall of the chamber 10. The bottom 12b serves as the bottom of the chamber 10. The chamber main body 12 is formed of a metal such as aluminum. On an inner wall surface of the chamber main body 12, a plasma-resistant film is formed. This film may be a ceramic film such as an alumite film or an yttrium oxide film. The chamber main body 12 is grounded.

A passageway 12p is formed at the side wall 12a. The substrate W passes through the passageway 12p when transferred between the internal space 10s and the outside of the chamber 10. The passageway 12p can be opened/closed by a gate valve 12g. The gate valve 12g is provided along the side wall 12a.

A substrate support, i.e., a supporting table 14 is provided in the internal space 10s. The supporting table 14 is supported by a support 15. The support 15 has a cylindrical shape. The support 15 extends upwards from the bottom 12b of the chamber main body 12. The support 15 has an insulation property. The support 15 is formed of, for example, ceramic.

The supporting table 14 is configured to support the substrate W. The supporting table 14 shares the central axis AX with the chamber 10. The supporting table 14 provides a placing region 14r. The center of the placing region 14r is located on the central axis AX. The substrate W is placed on the placing region 14r such that the center of the substrate W is located on the central axis AX.

The supporting table 14 includes an electrode plate 16, a lower electrode 18 and an electrostatic chuck 20. The electrode plate 16 has a substantially disk shape. The electrode plate 16 has conductivity. The electrode plate 16 is formed of a metal such as aluminum. The lower electrode 18 has a disk shape. The lower electrode 18 has conductivity. The lower electrode 18 is formed of a metal such as aluminum. The lower electrode 18 is placed on the electrode plate 16. The lower electrode 18 is electrically connected to the electrode plate 16.

A flow path 18p is formed inside the lower electrode 18. The flow path 18p extends, for example, in a spiral shape inside the lower electrode 18. A heat exchange medium (for example, a coolant) is supplied into the flow path 18p from a circulation device 22 (for example, a chiller unit) for circulating the heat exchange medium. The circulation device 22 is provided outside the chamber 10. The heat exchange medium supplied into the flow path 18p is returned to the circulation device 22. Heat exchange between the heat exchange medium and the lower electrode 18 controls a temperature of the substrate W placed on the supporting table 14.

The electrostatic chuck 20 is provided on the lower electrode 18. The electrostatic chuck 20 has a substantially disk shape. The electrostatic chuck 20 has a main body and an electrode. The main body of the electrostatic chuck 20 is formed of a dielectric material (for example, ceramic). The electrode of the electrostatic chuck 20 is a conductive film provided in the main body of the electrostatic chuck 20. A DC power supply 24 is connected to the electrode of the electrostatic chuck 20 via a switch. The electrostatic chuck 20 provides the above-described placing region 14r. When a DC voltage from the DC power supply 24 is applied to the electrode of the electrostatic chuck 20 while the substrate W is placed on the electrostatic chuck 20 (on the placing region 14r), an electrostatic attraction force is generated between the substrate W and the electrostatic chuck 20. The substrate W is attracted to the electrostatic chuck 20 by the generated electrostatic attraction force to be held by the electrostatic chuck 20. The plasma processing apparatus 1 may be provided with a heat transfer gas supply line for supplying a heat transfer gas (for example, He gas) between the electrostatic chuck 20 and a lower surface of the substrate W.

One or more heaters (for example, one or more resistance heating elements) may be provided inside the electrostatic chuck 20. When a power is supplied from a heater controller to one or more heaters, the one or more heaters generate heat and the temperature of the electrostatic chuck 20 and also the temperature of the substrate W are adjusted.

A focus ring FR is placed on the supporting table 14. The focus ring FR is placed to surround the electrostatic chuck 20 and the edge of the substrate W. The focus ring FR is an annular plate formed of a silicon-containing material such as silicon or quartz. The focus ring FR is used to improve uniformity in plasma processing.

A cylindrical conductor 26 is provided around the support 15. The conductor 26 is grounded. A cylindrical insulator 28 is provided above the conductor 26 so as to surround the supporting table 14. The insulator 28 is formed of ceramic such as quartz. An exhaust path is formed between the supporting table 14 and the side wall 12a of the chamber main body 12. A baffle plate 30 is provided in the exhaust path. The baffle plate 30 is an annular plate. The baffle plate 30 has a plurality of holes penetrating the baffle plate 30 in a thickness direction thereof. The baffle plate 30 is formed by forming a plasma-resistant film such as yttrium oxide on the surface of a member formed of a metal such as aluminum.

Below the baffle plate 30, an exhaust pipe 32 is connected to the bottom 12b of the chamber main body 12. The exhaust pipe 32 can communicate with the exhaust path. An exhaust device 34 is connected to the exhaust pipe 32. The exhaust device 34 includes an automatic pressure control valve and a decompression pump such as a turbo molecular pump. By operating the exhaust device 34, the pressure of the internal space 10s is set to a specified pressure.

An upper electrode 36 is provided above the supporting table 14. A part of the internal space 10s is interposed between the upper electrode 36 and the supporting table 14. The upper electrode 36 is provided to close an upper opening of the chamber main body 12. A member 37 is interposed between the upper electrode 36 and an upper end of the chamber main body 12. The member 37 is formed of an insulating material. The member 37 may be formed of ceramic, for example, quartz. In the exemplary embodiment, the member 37 and a part of a ground conductor to be described below may be interposed between the upper electrode 36 and the upper end of the chamber main body 12.

In the exemplary embodiment, the upper electrode 36 constitutes a shower head. The upper electrode 36 includes a top plate 38 and a supporting body 40 in the exemplary embodiment. The top plate 38 is formed of, for example, silicon. Alternatively, the top plate 38 is formed by providing a coating film formed of ceramic such as yttrium oxide on a surface of a member formed of aluminum. The top plate 38 has a plurality of gas discharge openings 38h penetrating the top plate 38 in a thickness direction thereof.

The supporting body 40 is provided on the top plate 38. The supporting body 40 is configured to detachably support the top plate 38. The supporting body 40 is formed of a conductive material such as aluminum. A gas diffusion space 40d is formed inside the supporting body 40. The supporting body 40 has a plurality of holes 40h. The plurality of holes 40h extends downwards from the gas diffusion space 40d. The plurality of holes 40h communicates with the plurality of gas discharge openings 38h, respectively.

A gas supply 41 is connected to the gas diffusion space 40d. The gas supply 41 is configured to supply a gas into the chamber 10, i.e., into the internal space 10s. The gas supply 41 is configured to output a plurality of gases used in the method MT. In the exemplary embodiment, the plurality of gases used in the method MT include a fluorocarbon gas, a rare gas and a hydrocarbon gas. The fluorocarbon gas includes, for example, one or more of a $C_4F_6$ gas, a $C_4F_8$ gas and a $C_6F_8$ gas, but may be another fluorocarbon gas. The rare gas is, for example, an Ar gas, but may be another rare gas. The hydrocarbon gas is, for example, a $CH_4$ gas, but may be a hydrocarbon gas other than the $CH_4$ gas. The plurality of gases used in the method MT may further include other gases. The plurality of gases used in the method MT may further include one or more of a nitrogen gas ($N_2$ gas) and an oxygen-containing gas (for example, $O_2$ gas or CO gas). The gas supply 41 has a plurality of flow controllers and a plurality of valves. The gas supply 41 is configured to individually adjust a flow rate of one or more gases to be output. The gas output from the gas supply 41 is discharged from the plurality of gas discharge openings 38h into the internal space 10s through the gas diffusion space 40d and the plurality of holes 40h.

A flow path 40p is formed in the supporting body 40. A chiller unit 42 is connected to the flow path 40p. A coolant such as cooling water is circulated between the flow path 40p and the chiller unit 42. The temperature of the upper electrode 36 is adjusted by heat exchange between the coolant supplied into the flow path 40p from the chiller unit 42 and the upper electrode 36.

The plasma processing apparatus 1 further includes a first high frequency power supply 43 and a second high frequency power supply 44. The first high frequency power supply 43 and the second high frequency power supply 44 are provided outside the chamber 10. The first high frequency power supply 43 is configured to generate a first high frequency power mainly for plasma formation. A frequency of the first high frequency power is, for example, but not limited to, 100 MHz. The first high frequency power supply 43 is electrically connected to the upper electrode 36 via a matching unit 45 and a power feed conductor 48. The matching unit 45 has a matching circuit for matching an output impedance of the first high frequency power supply 43 with an impedance on a load side (on the upper electrode 36 side). A lower end of the power feed conductor 48 is connected to the upper electrode 36. The power feed conductor 48 extends upwards from the upper electrode 36. The power feed conductor 48 is a cylindrical or rod-shaped conductor, and its central axis substantially coincides with the central axis AX. The first high frequency power supply 43 may be electrically connected to the lower electrode 18 via the matching unit 45 instead of the upper electrode 36.

The second high frequency power supply 44 is configured to generate a second high frequency power, i.e., a high frequency bias power, mainly for ion attraction into the substrate W. A frequency of the second high frequency power is lower than the frequency of the first high frequency power. In the exemplary embodiment, the frequency of the second high frequency power may be higher than 13.56 MHz. In the exemplary embodiment, the frequency of the second high frequency power may be 40 MHz or more. In the exemplary embodiment, the frequency of the second high frequency power may be 60 MHz or more. The second high frequency power supply 44 is electrically connected to the lower electrode 18 via a matching unit 46. The matching unit 46 has a matching circuit for matching an output impedance of the second high frequency power supply 44 with an impedance on a load side (on the lower electrode 18 side).

The plasma processing apparatus 1 further includes a ground conductor 50. The ground conductor 50 has conductivity. The ground conductor 50 is formed of a metal such as aluminum. The ground conductor 50 is grounded. The ground conductor 50 extends to cover the upper electrode 36 above the chamber main body 12. The power feed conductor 48 extends upwards through a space surrounded by the ground conductor 50, and is connected to the first high frequency power supply 43 via the matching unit 45 outside the ground conductor 50.

In the internal space 10s of the plasma processing apparatus 1, electric field intensity distribution in which an electric field intensity is high above the center of the substrate W and low above the edge side of the substrate W is generated. That is, the non-uniform electric field intensity distribution in which the electric field intensity decreases as the distance from the central axis AX in a radial direction (i.e., diametrical direction) increases is generated in the internal space 10s. Under such a non-uniform electric field intensity distribution, the plasma density is high near the central axis AX and low at a position far from the central axis AX. That is, the plasma density is non-uniformly distributed in the radial direction with respect to the central axis AX. The plasma processing apparatus 1 further includes an electromagnet 60 to obtain uniform plasma density distribution.

As shown in FIG. 3, the electromagnet 60 is placed above the upper electrode 36. The electromagnet 60 forms magnetic field distribution, in which a horizontal component at a position far from the central axis AX is larger than a horizontal component on the central axis AX, in the internal space 10s. That is, the electromagnet 60 forms, in the internal space 10s, the magnetic field distribution in which the horizontal component increases in magnitude as the distance from the central axis AX in the radial direction increases. At a position where a magnetic field having a large horizontal component is formed, a residence time of electrons increases. As a result, the plasma density increases at the position where the magnetic field having a large horizontal component is formed. Therefore, according to the plasma processing apparatus 1, uniform plasma density distribution can be obtained in the radial direction with respect to the central axis AX. Therefore, according to the plasma processing apparatus 1, the in-plane uniformity in processing of the substrate W is improved.

In the exemplary embodiment, the electromagnet 60 has a yoke 62 and a coil 64. The yoke 62 is formed of a magnetic material. The yoke 62 has a base portion 62a and a plurality of cylindrical portions 62b. The base portion 62a has a substantially annular shape and a substantially plate shape, and extends in a direction orthogonal to the central axis AX. Each of the plurality of cylindrical portions 62b has a cylindrical shape, and extends downwards from the base portion 62a. The plurality of cylindrical portions 62b is provided coaxially around the center axis AX. The coil 64 is wound around the central axis AX. The coil 64 is provided between two cylindrical portions 62b that are adjacent in the diametrical direction. Also, the electromagnet 60 may have one or more coils 64. When the electromagnet 60 has a plurality of coils 64, the plurality of coils 64 is provided coaxially around the central axis AX.

The coil 64 of the electromagnet 60 is connected to a driving power supply 66 through a wiring 68. When a current from the driving power supply 66 is applied to the coil 64, a magnetic field is formed by the electromagnet 60. At a position where the angle of a vector of the magnetic field formed by the electromagnet 60 is 45°, an electron confinement effect (effect of suppressing diffusion of electrons) in the radial direction (diametrical direction) and an electron extinction suppressing effect (effect of suppressing electrons from reaching the electrode) are well compatible with each other. Therefore, at that position, the plasma density increases. Accordingly, if the radius of the substrate W is, for example, 150 mm, the electromagnet 60 may be configured such that the distance between the position where the angle of the vector of the magnetic field is 45° and the central axis AX is 135 mm or more and 185 mm or less. In the exemplary embodiment, an average value of an inner diameter and an outer diameter of one coil 64 of the electromagnet 60 is equal to or greater than the distance between the central axis AX and the edge of the substrate W. If the radius of the substrate W is 150 mm, the average value of the inner diameter and the outer diameter of one coil 64 of the electromagnet 60 is set to 150 mm or more and 250 mm or less. The angle of the vector of the magnetic field is 0° when the magnetic field has only a vertical component, and is 90° when the magnetic field has only a radial component (horizontal component). Accordingly, when the angle of the vector of the magnetic field is 45°, the magnetic field has both the horizontal component and the vertical component.

When the electromagnet 60 is placed in a space surrounded by the ground conductor covering the upper electrode, the first high frequency power is applied to the electromagnet 60 and/or the wiring that connects the electromagnet 60 and the power supply (driving power supply). As a result, the electric field intensity in the internal space 10s fluctuates locally. Therefore, the electromagnet 60 is placed outside the ground conductor. However, when the electromagnet 60 is placed in a space above an upper end of the ground conductor, a vertical distance from the electromagnet 60 to the internal space 10s increases. Thus, it is difficult to efficiently generate the magnetic field having the sufficient magnitude in the internal space 10s unless a large current is applied to the coil 64. Further, when the electromagnet 60 is placed on the side of the ground conductor (outside the ground conductor in the radial direction from the central axis), a position where a magnetic field having a large horizontal component is formed or a position where a magnetic field whose vector has an angle of 45° is formed is located outside the internal space 10s. In order to efficiently form the magnetic field distribution suitable for obtaining the uniform plasma density distribution in the internal space 10s, the ground conductor 50 provides an external space ES in which the electromagnet 60 is placed. The external space ES is closer to the internal space 10s than the upper end of the ground conductor 50, spaced upwards from the upper electrode 36 and shielded from the upper electrode 36 by the ground conductor 50.

The ground conductor 50 includes a first portion 51, a second portion 52 and a third portion 53. The first portion 51 has a cylindrical shape. A central axis of the first portion 51 substantially coincides with the central axis AX. The first portion 51 extends upwards from the chamber main body 12. In the example shown in FIG. 3, the first portion 51 extends upwards from an upper end of the side wall 12a of the chamber main body 12. A lower end of the first portion 51 is interposed between the member 37 and the upper end of the side wall 12a.

The second portion 52 is spaced upwards from the upper electrode 36 and extends from the first portion 51 toward the central axis AX. The second portion 52 has a plate shape extending in a direction intersecting with or orthogonal to the central axis AX. The first portion 51 and the second portion 52 provide a first space IS1 above the upper electrode 36. The first space IS1 is a part of a space inside the ground conductor 50 (i.e., on the upper electrode 36 side). Due to the first space IS1, a vertical distance between the upper electrode 36 and the ground conductor 50 is ensured. Therefore, capacitive coupling between the ground conductor 50 and the upper electrode 36 is suppressed. The vertical distance between an upper surface of the upper electrode 36 and a lower surface of the second portion 52 of the ground conductor 50 is set to, for example, 60 mm or more.

The third portion 53 has a cylindrical shape. A central axis of the third portion 53 substantially coincides with the central axis AX. The third portion 53 extends at a position closer to the central axis than the first portion 51. The third portion 53 extends upwards from the second portion 52. The third portion 53 provides a second space IS2. The second space IS2 is a space inside the second portion 52 and is a part of the space inside the ground conductor 50 (i.e., on the upper electrode 36 side). The second space IS2 is continuous with the first space IS1. Also, the power feed conductor 48 extends upwards through the first space IS1 and the second space IS2.

The external space ES is provided by the ground conductor 50 outside the third portion 53, on the second portion 52 and above the internal space 10s. The external space ES extends at the outside of the third portion 53 and on the second portion 52 in a circumferential direction around the central axis AX. The electromagnet 60 is placed in the external space ES. Further, the vertical distance between a lower end of the electromagnet 60 placed in the external space ES and an upper surface of the upper electrode 36 is greater than 60 mm. Furthermore, the vertical distance between the lower end of the electromagnet 60 and the substrate W placed on the supporting table 14 may be 230 mm or less.

The distance between the electromagnet 60 placed in the external space ES and the internal space 10s is relatively short. Further, as described above, the electromagnet 60 forms the magnetic field distribution, in which the low horizontal component is located near the central axis AX and the large horizontal component is located at a position far from the central axis, in the internal space 10s. Therefore, the magnetic field distribution suitable for obtaining the uniform plasma density distribution can be efficiently formed in the internal space 10s by the electromagnet 60 placed outside the ground conductor 50.

The driving power supply 66 is connected to the coil 64 of the electromagnet 60 as described above. The electromagnet 60 and the driving power supply 66 are placed outside the ground conductor 50. Therefore, a filter configured to suppress introduction of a high frequency power into the driving power supply 66 may not be provided between the coil 64 and the driving power supply 66.

In the exemplary embodiment, the ground conductor 50 further includes a fourth portion 54, a fifth portion 55 and a sixth portion 56. The fourth portion 54 extends above the second portion 52 from the third portion 53 in the radial direction with respect to the central axis AX. The fourth portion 54 has a plate shape extending in the direction intersecting with or orthogonal to the central axis AX. The fifth portion 55 has a cylindrical shape. A central axis of the fifth portion 55 substantially coincides with the central axis AX. The fifth portion 55 is farther from the central axis than the third portion 53, and extends upwards from the fourth portion 54. The sixth portion 56 extends above the fourth portion 54 from the fifth portion 55 toward the central axis AX. The sixth portion 56 has a plate shape extending in the direction intersecting with or orthogonal to the central axis AX. In the exemplary embodiment, the ground conductor 50 further has a lid 57 extending from the sixth portion to the vicinity of the power feed conductor 48.

The fourth portion 54, the fifth portion 55 and the sixth portion 56 provide a third space IS3. The third space IS3 is a space surrounded by the fourth portion 54, the fifth portion 55 and the sixth portion 56 and is a part of the space inside the ground conductor 50. The third space IS3 is continuous with the second space IS2. The power feed conductor 48 extends upwards through the third space IS3. In the example shown in FIG. 3, the first to sixth portions are formed of three members, but the number of members forming the ground conductor 50 may vary.

Figure 4:
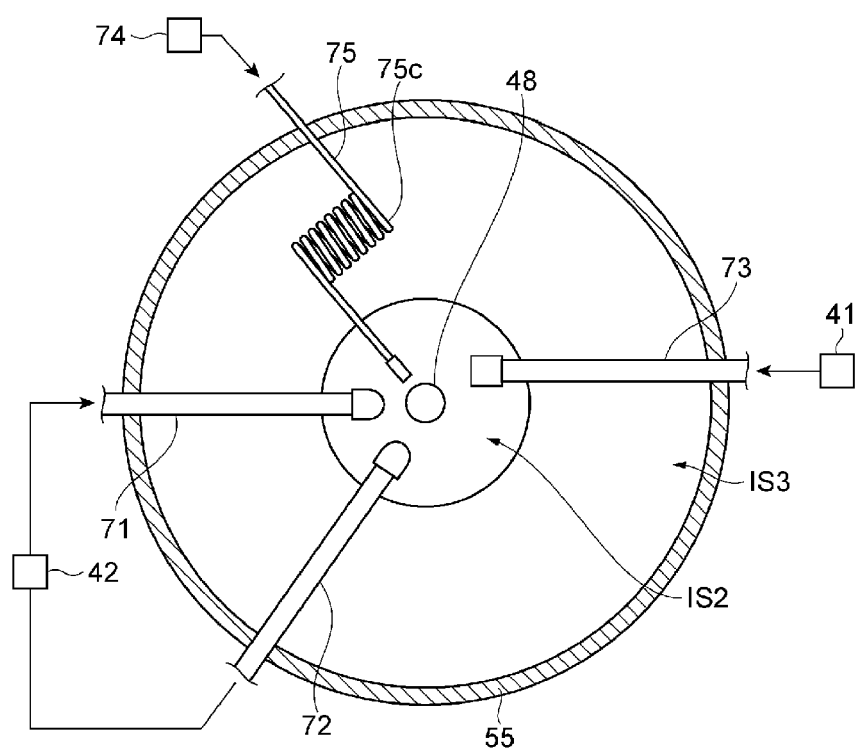
FIG. 4 is a plan view illustrating an example of an internal configuration of a ground conductor of the plasma processing apparatus illustrated in FIG. 3.

Hereinafter, FIG. 4 will be referred to together with FIG. 3. FIG. 4 is a plan view illustrating an example of an internal configuration of the ground conductor of the plasma processing apparatus illustrated in FIG. 3. FIG. 4 shows a state in which the fifth portion 55 of the ground conductor 50 is cut off along a horizontal plane. In the exemplary embodiment, the plasma processing apparatus 1 further includes a pipe 71 as shown in FIG. 3 and FIG. 4. The pipe 71 extends upwards from the upper electrode 36 through the first space IS1 and the second space IS2, and extends laterally to the outside of the ground conductor 50 through the third space IS3. The pipe 71 is connected to the chiller unit 42 at the outside of the ground conductor 50. The coolant from the chiller unit 42 is supplied to the flow path 40p through the pipe 71. In the third space IS3, the pipe 71 is substantially shielded from the upper electrode 36 by the fourth portion 54 of the ground conductor 50.

The plasma processing apparatus 1 further includes a pipe 72. The pipe 72 extends upwards through the first space IS1 and the second space IS2, and extends laterally to the outside of the ground conductor 50 through the third space IS3. The pipe 72 is connected to the chiller unit 42 at the outside of the ground conductor 50. The coolant is returned from the flow path 40p to the chiller unit 42 through the pipe 72. In the third space IS3, the pipe 72 is substantially shielded from the upper electrode 36 by the fourth portion 54 of the ground conductor 50.

In the exemplary embodiment, the plasma processing apparatus 1 further includes a pipe 73. The pipe 73 extends upwards from the upper electrode 36 through the first space IS1 and the second space IS2, and extends laterally to the outside of the ground conductor 50 through the third space IS3. The pipe 73 is connected to the gas supply 41 at the outside of the ground conductor 50. The gas output from the gas supply 41 is supplied to the upper electrode 36, i.e., the shower head, through the pipe 73. In the third space IS3, the pipe 73 is substantially shielded from the upper electrode 36 by the fourth portion 54 of the ground conductor 50. The gas supply 41 and the upper electrode 36 (i.e., the shower head) may be connected to each other via a plurality of pipes.

In the exemplary embodiment, the plasma processing apparatus 1 further includes a DC power supply 74 and a wiring 75. The DC power supply 74 is configured to generate a negative DC voltage applied to the upper electrode 36. The wiring 75 connects the DC power supply 74 and the upper electrode 36 to each other. The wiring 75 may include a coil 75c. The coil 75c is provided in the third space IS3. The wiring 75 extends upwards from the upper electrode 36 through the first space IS1 and the second space IS2, and extends laterally to the outside of the ground conductor 50 through the third space IS3. The wiring 75 is electrically insulated from the fifth portion 55 and the ground conductor 50. The wiring 75 is connected to the DC power supply 74 at the outside of the ground conductor 50. In the third space IS3, the wiring 75 is substantially shielded from the upper electrode 36 by the fourth portion 54 of the ground conductor 50.

In the exemplary embodiment, the plasma processing apparatus 1 further includes a controller 80. The controller 80 is configured to control the components of the plasma processing apparatus 1. The controller 80 can be a computer device. The controller 80 may include a processor, a storage device such as a memory, an input device such as a keyboard, a mouse or a touch panel, a display device, a control signal input/output interface, and the like. The storage device stores a control program and recipe data. The processor of the controller 80 executes the control program and sends a control signal to control each component of the plasma processing apparatus 1 based on the recipe data. The controller 80 can control each component of the plasma processing apparatus 1 to perform the method MT.

Figure 5:
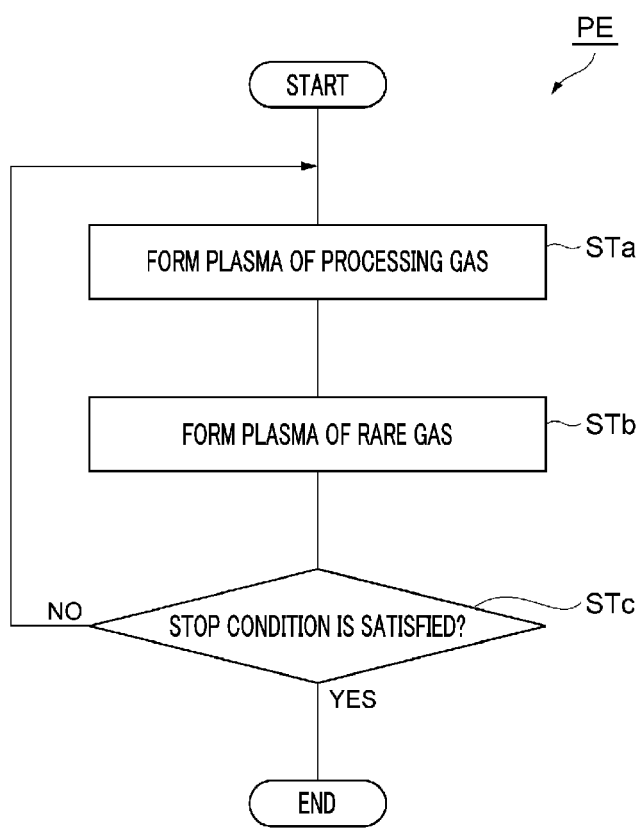
FIG. 5 is a flowchart showing an example of a processing that can be performed in each of a process ST1 and a process ST3 shown in FIG. 1.
Figure 6A:
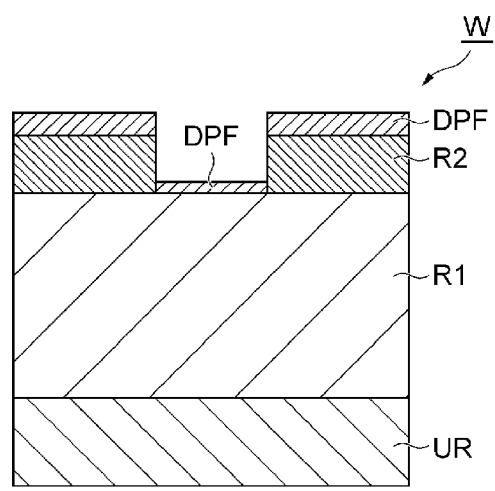
FIG. 6A is a partial cross-sectional view of the example substrate to which a process STa shown in FIG. 5 is applied in the process ST1 of a method MT.
Figure 6B:
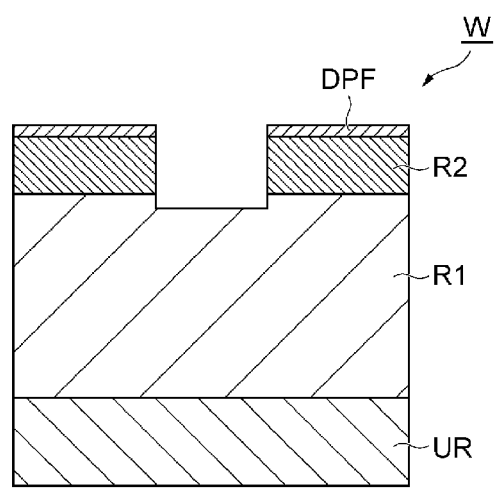
FIG. 6B is a partial cross-sectional view of the example substrate to which a process STb shown in FIG. 5 is applied in the process ST1 of the method MT.
Figure 7:
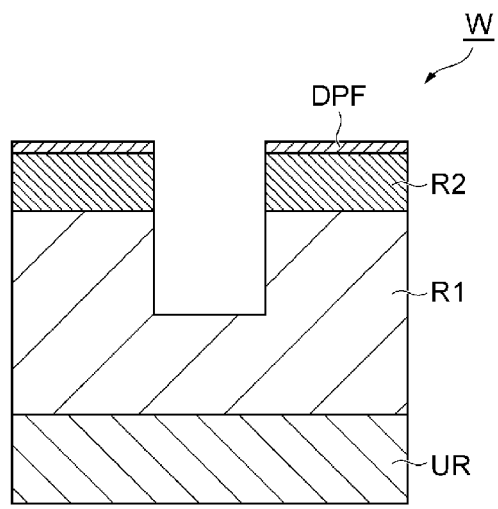
FIG. 7 is a partial cross-sectional view of the example substrate to which the process ST1 of the method MT is applied.
Figure 8:
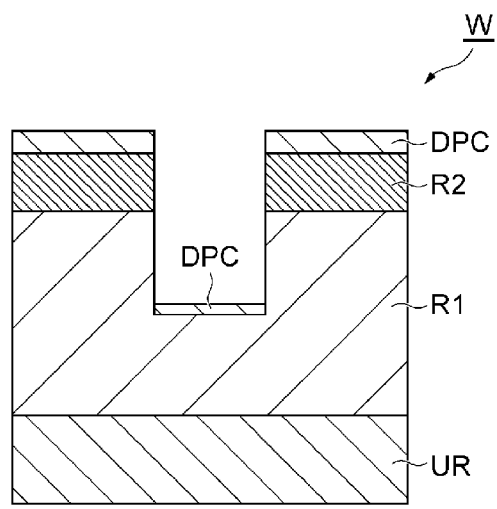
FIG. 8 is a partial cross-sectional view of the example substrate to which a process ST2 of the method MT is applied.
Figure 9A:
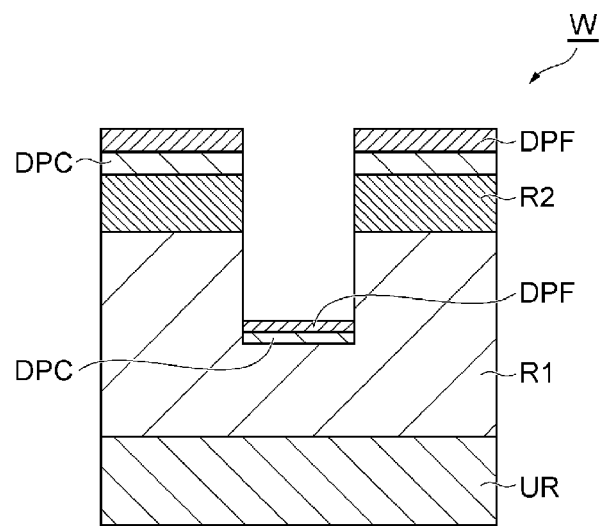
FIG. 9A is a partial cross-sectional view of the example substrate to which the process STa is applied in the process ST3 of the method MT.
Figure 9B:
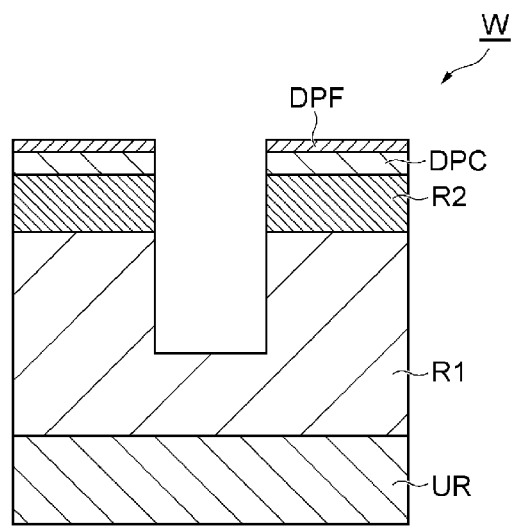
FIG. 9B is a partial cross-sectional view of the example substrate to which the process STb is applied in the process ST3 of the method MT.
Figure 10:
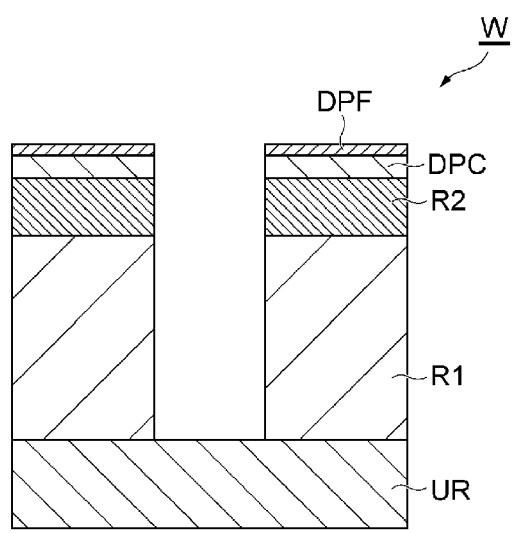
FIG. 10 is a partial cross-sectional view of the example substrate to which the process ST3 of the method MT is applied.

FIG. 1 will be referred to again. Also, FIG. 5, FIG. 6A, FIG. 6B, FIG. 7, FIG. 8, FIG. 9A, FIG. 9B and FIG. 10 will be referred to together with FIG. 1. FIG. 5 is a flowchart showing an example of a processing that can be performed in each of a process ST1 and a process ST3 shown in FIG. 1. FIG. 6A is a partial cross-sectional view of an example substrate to which a process STa shown in FIG. 5 is applied in the process ST1 of the method MT, and FIG. 6B is a partial cross-sectional view of the example substrate to which a process STb shown in FIG. 5 is applied in the process ST1 of the method MT. FIG. 7 is a partial cross-sectional view of the example substrate to which the process ST1 of the method MT is applied. FIG. 8 is a partial cross-sectional view of the example substrate to which a process ST2 of the method MT is applied. FIG. 9A is a partial cross-sectional view of the example substrate to which the process STa is applied in the process ST3 of the method MT, and FIG. 9B is a partial cross-sectional view of the example substrate to which the process STb is applied in the process ST3 of the method MT. FIG. 10 is a partial cross-sectional view of the example substrate to which the process ST3 of the method MT is applied. Hereinafter, the method MT will be described in detail with reference to an example where the method MT is applied to the substrate W shown in FIG. 2 by using the plasma processing apparatus 1. Also, hereinafter, the control of each component of the plasma processing apparatus 1 by the controller 80 will be described.

In the method MT, the substrate W is placed on the supporting table 14 (on the electrostatic chuck 20) and held by the electrostatic chuck 20. Then, in the method MT, the process ST1 is performed. In the process ST1, the first region R1 is etched by plasma etching. In the process ST1, the first region R1 is selectively etched with respect to the second region R2. Further, in the process ST1, the first region R1 is etched such that an upper surface thereof is provided at a deeper position within the substrate W than the second region R2.

The controller 80 implements a first control to perform the process ST1. In the first control, the controller 80 controls the gas supply 41 and the first high frequency power supply 43 and/or the second high frequency power supply 44. In the first control, the controller 80 further controls the exhaust device 34 to adjust the pressure inside the chamber 10. By performing the first control, the first region R1 is etched by the plasma etching such that the upper surface thereof is provided at a deeper position within the substrate W than the second region R2.

In the exemplary embodiment, a processing PE shown in FIG. 5 is performed in the process ST1. The processing PE includes the process STa and the process STb. In the process STa, plasma of a processing gas containing the fluorocarbon gas is formed inside the chamber 10. In the process STa, fluorocarbon in the formed plasma is deposited on the substrate W to form a deposit DPF on the substrate W. According to the process STa in the process ST1, the deposit DPF is formed on the substrate W, for example, as shown in FIG. 6A.

The fluorocarbon gas used in the process STa may include one or more of a $C_4F_6$ gas, a $C_4F_8$ gas and a $C_6F_8$ gas. The processing gas used in the process STa may further include one or more other gases in addition to the fluorocarbon gas. When the first region R1 of the substrate W is formed of a low dielectric constant material (for example, SiOC or SiOCH), the processing gas used in the process STa further includes a rare gas (for example, Ar gas) in addition to the fluorocarbon gas. Alternatively, when the first region R1 of the substrate W is formed of a low dielectric constant material (for example, SiOC or SiOCH), the processing gas used in the process STa may further include a rare gas (for example, Ar gas) and a nitrogen gas ($N_2$ gas) in addition to the fluorocarbon gas.

When the first region R1 of the substrate W is formed of $SiO_2$, the processing gas used in the process STa may further include a rare gas (for example, Ar gas) in addition to the fluorocarbon gas. Alternatively, when the first region R1 of the substrate W is formed of $SiO_2$, the processing gas used in the process STa may further include a rare gas (for example, Ar gas) and an oxygen-containing gas (for example, $O_2$ gas or CO gas) in addition to the fluorocarbon gas.

The control (hereinafter, referred to as "control A") by the controller 80 for preforming the process STa includes controlling the gas supply 41 to supply the processing gas into the chamber 10 and controlling the first high frequency power supply 43 to supply the first high frequency power. The control A includes controlling the exhaust device 34 to set the pressure inside the chamber 10 to a specified pressure. Further, the control A may further include controlling the second high frequency power supply 44 to stop the output of the second high frequency power. Alternatively, the control A may further include controlling the second high frequency power supply 44 to supply the second high frequency power. However, the power level of the second high frequency power in the process STa is set lower than the power level of the second high frequency power in the process STb to be described below. When the processing PE is performed in the process ST1, the first control includes the control A.

In the process STb following the process STa, plasma of a rare gas is formed inside the chamber 10. In the process STb, a rare gas is supplied into the chamber 10. In the process STb, an $N_2$ gas and/or an $O_2$ gas may be supplied into the chamber 10 in addition to the rare gas. If the silicon-containing material in the first region R1 of the substrate W is a low dielectric constant material (for example, SiOC or SiOCH), an Ar gas, a gas mixture of an $N_2$ gas and Ar gas, or a gas mixture of an $N_2$ gas, an $O_2$ gas and an Ar gas may be supplied into the chamber 10 in the process STb. If the silicon-containing material in the first region R1 of the substrate W is $SiO_2$, an Ar gas may be supplied into the chamber 10 in the process STb. In the process STb, rare gas ions from the rare gas plasma are supplied to the substrate W. As a result, the fluorocarbon in the deposit DPF formed on the first region R1 reacts with the material forming the first region R1, and, thus, the first region R1 is etched. Meanwhile, the second region R2 is protected by the deposit DPF formed thereon. According to the process STb in the process ST1, the first region R1 is etched, for example, as shown in FIG. 6B.

The control by the controller 80 for performing the process STb (hereinafter, referred to as "control B") includes controlling the gas supply 41 to supply the above-described gas including the rare gas into the chamber 10 and controlling the first high frequency power supply 43 to supply the first high frequency power. The control B further includes controlling the second high frequency power supply 44 to supply the second high frequency power. Also, the control B includes controlling the exhaust device 34 to set the pressure inside the chamber 10 to a specified pressure.

In the exemplary embodiment, the process STa and the process STb are repeated alternately. In this exemplary embodiment, the controller 80 repeatedly performs a control sequence including the control A and the control B to alternately repeat the process STa and the process STb. In this exemplary embodiment, a process STc is performed. In the process STc, it is determined whether or not a stop condition is satisfied. The stop condition is a condition for determining whether or not to stop the alternating repetition of the process STa and the process STb. The stop condition is satisfied, for example, when the number of times of alternately repeating the process STa and the process STb reaches a predetermined number of times. When it is determined in the process STc that the stop condition is not satisfied, the process STa and process STb are sequentially performed again. Meanwhile, when it is determined in the process STc that the stop condition is satisfied, the processing PE is ended. In the processing PE, each of the processes STa and STb may be performed only once. In this case, the processing PE does not include the process STc.

According to the processing PE, the second region R2 is protected by the deposit DPF formed thereon. Therefore, etching of the second region R2 following the etching of the first region R1 is suppressed. When the processing PE is performed in the process ST1, the substrate W is processed to have a shape as shown in FIG. 7. That is, the substrate W is processed such that the first region R1 has its upper surface at a deeper position within the substrate W than the second region R2.

In the process ST1 according to another exemplary embodiment, plasma of the processing gas containing the fluorocarbon gas may be formed inside the chamber 10 in which the substrate W is placed. In this exemplary embodiment, the first region R1 may be etched by active species of fluorocarbon and/or active species of fluorine in the plasma that collide against the substrate W. In the first control for performing the process ST1 of this exemplary embodiment, the controller 80 controls the gas supply 41 to supply the processing gas into the chamber 10. Further, in the first control for performing the process ST1 of this exemplary embodiment, the controller 80 controls the exhaust device 34 to set the pressure inside the chamber 10 to a specified pressure. Furthermore, in the first control for performing the process ST1 of this exemplary embodiment, the controller 80 controls the first high frequency power supply 43 to supply the first high frequency power and controls the second high frequency power supply 44 to supply the second high frequency power.

After the process ST1, the process ST2 is performed. While the process ST2 is performed, the substrate W to which the process ST1 has been performed is accommodated inside the chamber 10. In the process ST2, plasma of a hydrocarbon gas is formed within the chamber 10. In the process ST2, the hydrocarbon gas is supplied into the chamber 10. The hydrocarbon gas is, for example, but not limited to, a $CH_4$ gas. In the process ST2, a rare gas (for example, Ar gas) may be supplied into the chamber in addition to the hydrocarbon gas. In the process ST2, the gas supplied into the chamber 10 is excited to form plasma.

In the process ST2, magnetic field distribution is formed inside the chamber 10 by the electromagnet 60 in a state that the plasma is formed. Specifically, the electromagnet 60 forms the magnetic field distribution in which the horizontal component on the edge side of the substrate W is larger than the horizontal component on the center of the substrate W.

In the process ST2, a deposit DPC containing carbon in the plasma is formed on the substrate W as shown in FIG. 8. As a result of the plasma etching in the process ST1, the first region R1 extends at a deeper position within the substrate W than the second region R2. Therefore, the thickness of the deposit DPC is large on the second region R2 and small on the first region R1. Further, since the above-described magnetic field is formed inside the chamber 10 by the electromagnet 60, the uniform plasma density distribution can be obtained in the radial direction with respect to the central axis AX. Since carbon species in the plasma with such distribution are deposited on the substrate W, the in-plane uniformity in the thickness of the deposit DPC is improved. In FIG. 8, the illustration of the deposit DPF that may be left on the substrate W after the end of the process ST1 is omitted.

The controller 80 implements a second control to perform the process ST2. In the second control, the controller 80 controls the gas supply 41 to supply the above-described gas including a hydrocarbon gas into the chamber 10, and controls the first high frequency power supply 43 to supply the first high frequency power. In the second control, the controller 80 further controls the exhaust device 34 to set the pressure inside the chamber 10 to a specified pressure. In the second control, the controller 80 further controls the driving power supply 66 to form the above-described magnetic field distribution by the electromagnet 60. In the second control, the controller 80 may further control the second high frequency power supply 44 to stop the output of the second high frequency power. Alternatively, in the second control, the controller 80 may further control the second high frequency power supply 44 to supply the second high frequency power. However, the power level of the second high frequency power in the second control is set low to suppress physical etching of the substrate W caused by ion collision.

After the process ST2, the process ST3 is performed. The process ST3 may be performed in a state where the substrate W to which process ST2 has been performed is placed in the chamber 10. In the process ST3, the first region R1 is further etched by plasma etching. In the process ST3, the first region R1 is selectively etched with respect to the second region R2. The controller 80 implements a third control to perform the process ST3. In the third control, the controller 80 controls the gas supply 41 and the first high frequency power supply 43 and/or the second high frequency power supply 44. In the third control, the controller 80 further controls the exhaust device 34 to adjust the pressure inside the chamber 10. By implementing the third control, the first region R1 is further etched by the plasma etching.

In the process ST3 according to the exemplary embodiment, the processing PE described above in relation to the process ST1 may be performed. When the processing PE is performed in the process ST3, plasma of the processing gas containing the fluorocarbon gas is formed inside the chamber 10 in the process STa. In the process STa, fluorocarbon in the formed plasma is deposited on the substrate W to form a deposit DPF on the substrate W. According to the process STa in the process ST3, the deposit DPF is formed on the substrate W, for example, as shown in FIG. 9A. The control by the controller 80 for performing the process STa in the process ST3 is the above-described control A.

When the processing PE is performed in the process ST3, plasma of the rare gas is formed inside the chamber 10 in the process STb. In the process STb, the rare gas is supplied into the chamber 10. In the process STb, an $N_2$ gas and/or an $O_2$ gas may be supplied into the chamber 10 in addition to the rare gas. In the process STb, rare gas ions in the rare gas plasma are supplied to the substrate W. As a result, the fluorocarbon in the deposit DPF formed on the first region R1 reacts with the material forming the first region R1, and, thus, the first region R1 is etched. Meanwhile, the second region R2 is protected by the deposit DPF formed thereon. According to the process STb in the process ST3, the first region R1 is etched, for example, as shown in FIG. 9B. The control by the controller 80 for performing the process STb in the process ST3 is the above-described control B.

When the processing PE is performed in the process ST3, a sequence including the processes STa and STb may be performed one or more times. In addition, the controller 80 may perform a control sequence including the control A and the control B one or more times to perform the processing PE in the process ST3.

In the process ST3 according to another exemplary embodiment, plasma of the processing gas containing the fluorocarbon gas may be formed inside the chamber 10 in which the substrate W is placed. In this exemplary embodiment, the first region R1 may be etched by active species of fluorocarbon and/or active species of fluorine in the plasma that collide against the substrate W. In the third control for performing the process ST3 of this exemplary embodiment, the controller 80 controls the gas supply 41 to supply the processing gas into the chamber 10. In the third control for performing the process ST3 of this exemplary embodiment, the controller 80 controls the exhaust device 34 to set the pressure inside the chamber 10 to a specified pressure. Furthermore, in the third control for performing the process ST3 of this exemplary embodiment, the controller 80 controls the first high frequency power supply 43 to supply the first high frequency power and controls the second high frequency power supply 44 to supply the second high frequency power.

In the exemplary embodiment, as shown in FIG. 1, the process ST2 and the process ST3 are repeated alternately. In this exemplary embodiment, the controller 80 alternately repeats the second control and the third control. In this exemplary embodiment, a process ST4 is performed. In the process ST4, it is determined whether or not a stop condition is satisfied. The stop condition is a condition for determining whether or not to stop the alternating repetition of process ST2 and process ST3. The stop condition is satisfied, for example, when the number of times of alternately repeating the process ST2 and the process ST3 reaches a predetermined number of times. If it is determined in the process ST4 that the stop condition is not satisfied, the process ST2 and the process ST3 are sequentially performed again. Meanwhile, when it is determined in the process ST4 that the stop condition is satisfied, the method MT is ended. Consequently, the first region R1 is etched as shown in FIG. 10. Each of the process ST2 and the process ST3 may be performed only once. In this case, the method MT does not include the process ST4.

In the method MT according to the above-described exemplary embodiment, the deposit DPC is formed of the carbon species in the plasma of the hydrocarbon gas. In the substrate W to which the process ST1 has been performed, the first region R1 extends at a deeper position within the substrate W than the second region R2, and, thus, the thickness of the deposit DPC is larger on the second region R2 and smaller on the first region R1. While the second region R2 is protected by the deposit DPC, the first region R1 is further etched. Therefore, the etching selectivity of the first region R1 of the substrate W with respect to the second region R2 of the substrate W is increased. Further, while the process ST2 is performed, the electromagnet 60 forms the magnetic field distribution in which the horizontal component on the edge side of the substrate W is larger than the horizontal component on the center of the substrate W. Therefore, the density of the plasma on the edge side of the substrate W is increased. As a result, the uniform plasma density distribution can be obtained in the diametrical direction. Since the carbon species in the plasma with such distribution are deposited on the substrate W, the in-plane uniformity in the thickness of the deposit DPC is improved. Therefore, the in-plane uniformity in the selective etching of the first region R1 of the substrate W with respect to the second region R2 of the substrate W is improved.

In the exemplary embodiment, as described above, the process ST2 and the process ST3 are repeated alternately. That is, in this exemplary embodiment, the forming of the deposit DPC and the etching of the first region R1 are repeated alternately. According to this exemplary embodiment, the deposit DPC is formed again on the substrate W before the process ST3 is further performed. Therefore, the etching of the second region R2 is further suppressed, and the selectivity in the etching of the first region R1 is further increased.

Figure 11:
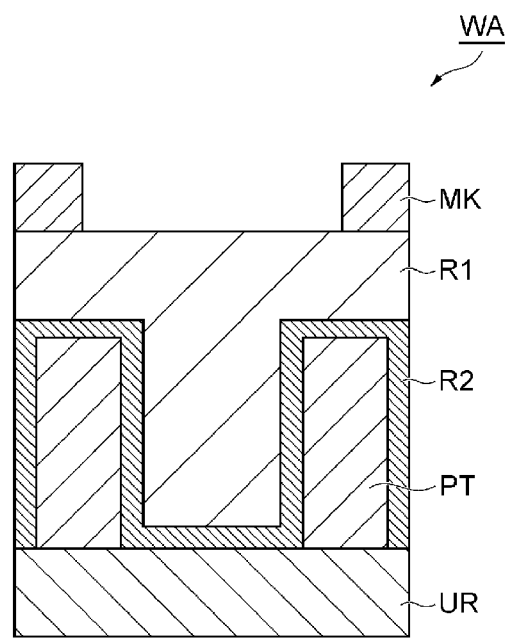
FIG. 11 is a partial cross-sectional view of another example substrate.

Hereinafter, a substrate according to another example to which the method MT can be applied will be described. FIG. 11 is a partial cross-sectional view of another example substrate. The method MT can be applied to a substrate WA shown in FIG. 11. The substrate WA has an underlying region UR, a first region R1 and a second region R2. In the example, the substrate WA is a product obtained during the manufacture of a fin-type field effect transistor.

The underlying region UR is formed of, for example, polycrystalline silicon. In the example, the underlying region UR is a fin region and has a substantially rectangular parallelepiped shape. The substrate WA has a plurality of protrusions PT. The plurality of protrusions PT is provided on the underlying region UR so as to be substantially parallel with each other. In the example, each of the plurality of protrusions PT is a gate region.

The second region R2 is formed of silicon nitride. The second region R2 is provided so as to cover the plurality of protrusions PT and the underlying region UR. The second region R2 extends along the surfaces of the plurality of protrusions PT and the surface of the underlying region UR between adjacent protrusions PT. The second region R2 is provided so as to provide a recess between the adjacent protrusions PT.

The first region R1 is formed of silicon oxide. The first region R1 is provided in the above-described recess provided by the second region R2. The first region R1 is provided so as to cover the second region R2. A mask MK is provided on the first region R1. The mask MK is patterned so as to provide an opening above the recess provided by the second region R2. The width of the opening of the mask MK is larger than the width of the recess provided by the second region R2. The mask MK is a mask formed of an organic film. The mask MK can be fabricated by photolithography.

Figure 12A:
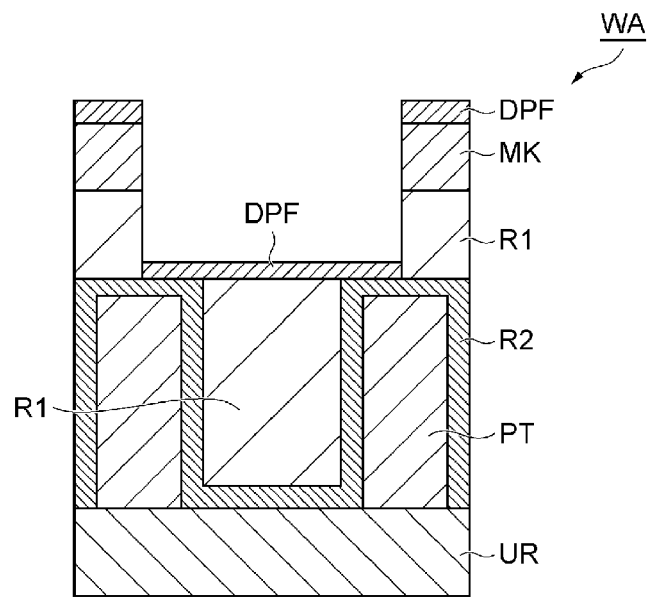
FIG. 12A is a partial cross-sectional view of another example substrate to which the process STa is applied in the process ST1 of the method MT.
Figure 12B:
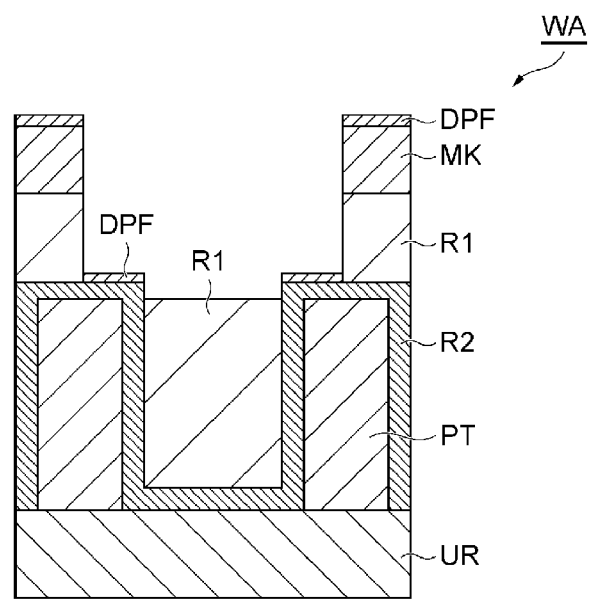
FIG. 12B is a partial cross-sectional view of another example substrate to which the process STb is applied in the process ST1 of the method MT.
Figure 13:
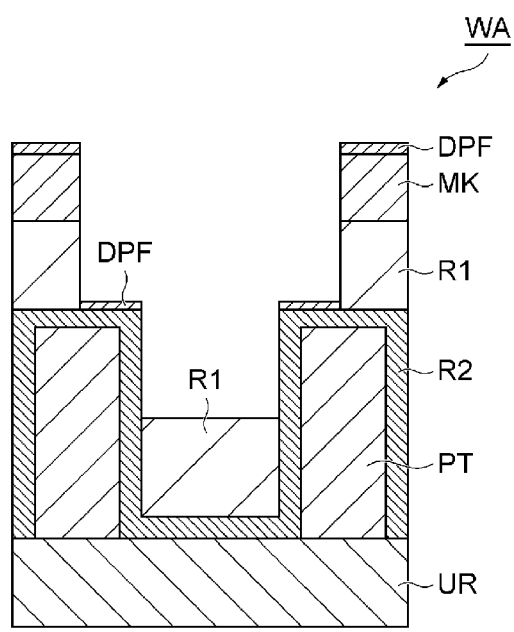
FIG. 13 is a partial cross-sectional view of another example substrate to which the process ST1 of the method MT is applied.
Figure 14:
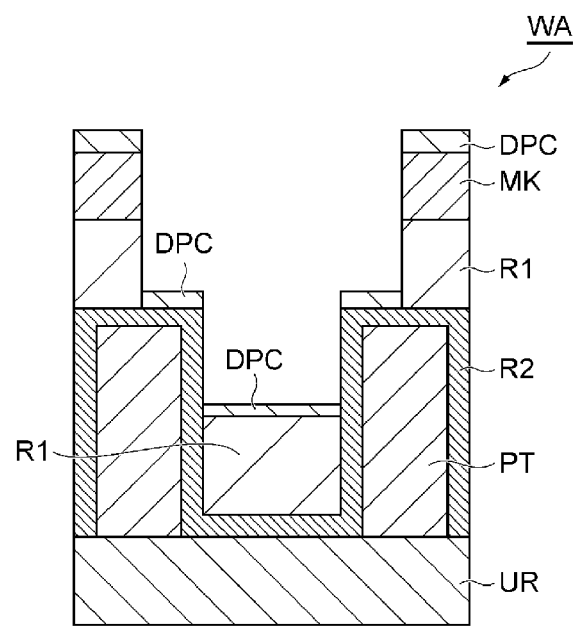
FIG. 14 is a partial cross-sectional view of another example substrate to which the process ST2 of the method MT is applied.
Figure 15A:
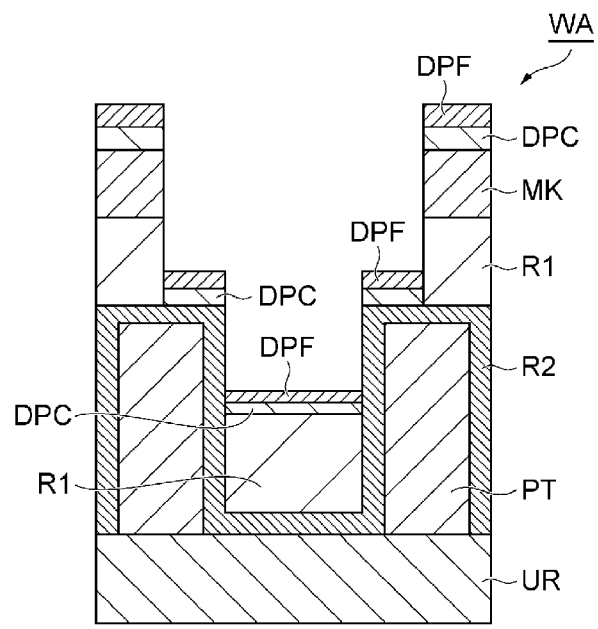
FIG. 15A is a partial cross-sectional view of another example substrate to which the process STa is applied in the process ST3 of the method MT.
Figure 15B:
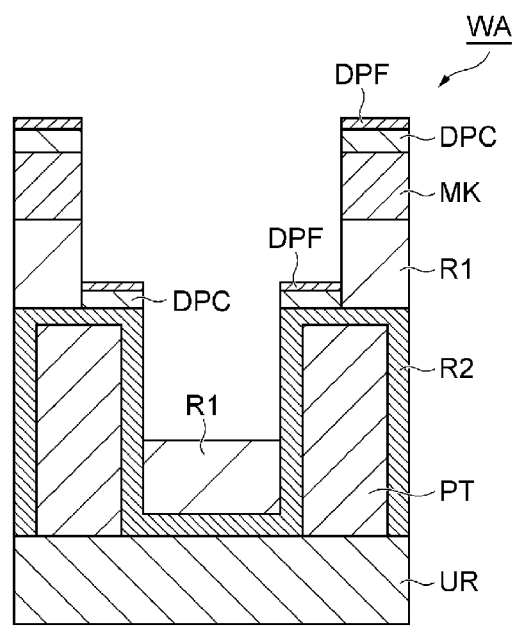
FIG. 15B is a partial cross-sectional view of another example substrate to which the process STb is applied in the process ST3 of the method MT.
Figure 16:
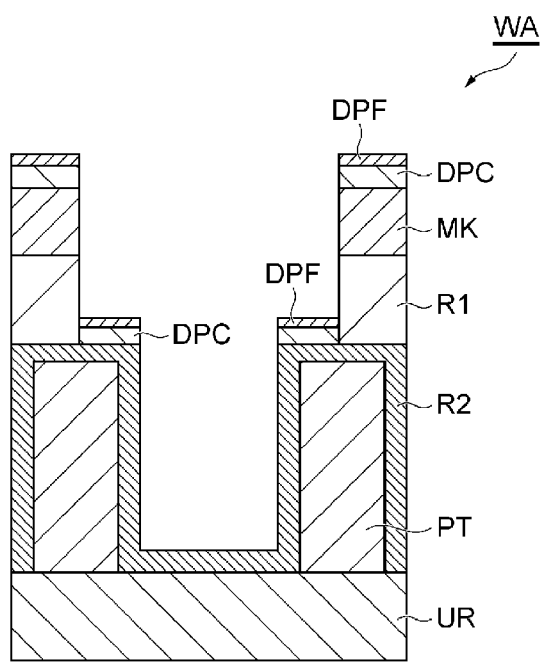
FIG. 16 is a partial cross-sectional view of another example substrate to which the process ST3 of the method MT is applied.

Hereinafter, FIG. 12A, FIG. 12B, FIG. 13, FIG. 14, FIG. 15A, FIG. 15B, and FIG. 16 will be referred to. FIG. 12A is a partial cross-sectional view of another example substrate to which the process STa is performed in the process ST1 of the method MT. FIG. 12B is a partial cross-sectional view of another example substrate to which the process STb is performed in the process ST1 of the method MT. FIG. 13 is a partial cross-sectional view of another example substrate to which the process ST1 of the method MT is performed. FIG. 14 is a partial cross-sectional view of another example substrate to which the process ST2 of the method MT is performed. FIG. 15A is a partial cross-sectional view of another example substrate to which the process STa is performed in the process ST3 of the method MT. FIG. 15B is a partial cross-sectional view of another example substrate to which the process STb is performed in the process ST3 of the method. FIG. 16 is a partial cross-sectional view of another example substrate to which the process ST3 of the method MT is performed.

When the substrate WA shown in FIG. 11 is placed inside the chamber 10 of the plasma processing apparatus 1 and the process STa of the processing PE is performed in the process ST1 of the method MT, a deposit DPF is formed on the substrate WA. FIG. 12A illustrates the substrate WA in a state after the first region R1 is etched in a depth direction of the substrate WA in the process ST1 and the process STa is further performed. When the process STa is performed, the deposit DPF is formed on the substrate WA as shown in FIG. 12A. Subsequently, when the process STb is performed, the first region R1 is further etched by the fluorocarbon in the deposit DPF as shown in FIG. 12B. When the process ST1 is ended, the substrate WA is processed to have a shape as shown in FIG. 13. That is, in the process ST1, the first region R1 is processed such that the upper surface thereof is provided at a deeper position within the substrate WA than the second region R2. In the process ST1 performed to the substrate WA, the first region R1 may also be etched by the active species of fluorocarbon and/or the active species of fluorine irradiated to the substrate WA from the plasma of the processing gas containing the fluorocarbon gas.

Then, when process ST2 is performed, a deposit DPC is formed on the substrate WA as shown in FIG. 14. In FIG. 14, the illustration of the deposit DPF that may be left on the substrate WA after the end of the process ST1 is omitted. When the process STa of the processing PE is performed in the subsequent process ST3, a deposit DPF is formed on the substrate WA as shown in FIG. 15A. Subsequently, when the process STb is performed, the first region R1 is further etched by the fluorocarbon in the deposit DPF as shown in FIG. 15B. By performing a sequence including the process ST2 and the process ST3 one or more times, the first region R1 is further etched, and, thus, the substrate WA is processed to have a shape as shown in FIG. 16. In the process ST3 performed to the substrate WA, the first region R1 may also be etched by the active species of fluorocarbon and/or the active species of fluorine radiated to the substrate WA from plasma of the processing gas containing the fluorocarbon gas.

While various exemplary embodiments have been described above, various omissions, substitutions, and changes may be made without being limited to the above-described exemplary embodiments. Further, other exemplary embodiments can be implemented by combining elements in different exemplary embodiments.

For example, the process ST1, the process ST2 and the process ST3 may be performed using different plasma processing apparatuses, respectively. In the method MT, another plasma processing apparatus may be used as long as it can form the above-described magnetic field. For example, another plasma processing apparatus different from the plasma processing apparatus 1 may be a capacitively coupled plasma processing apparatus, inductively coupled plasma processing apparatus or a plasma processing apparatus configured to form plasma using a surface wave such as microwave.

The above-described magnetic field formed inside the chamber 10 by the electromagnet 60 in the process ST2 may be generated inside the chamber 10 in another process in addition to the process ST2. That is, the magnetic field may be generated inside the chamber 10 in at least one of the process ST1, the process ST3, the process STa in the process ST1, the process STb in the process ST1, the process STa in the process ST3 or the process STb in the process ST3.

Hereinafter, an experiment performed for evaluating the method MT will be described. The present disclosure is not limited to the following description of the experiment.

In the experiment, the process ST2 is performed on a sample substrate using the plasma processing apparatus 1. The conditions of the process ST2 are as follows:
<Conditions of Process ST2>
Pressure inside the chamber 10: 10 mTorr (1.333) pa
Gas supplied into the chamber 10: $CH_4$ gas (25 sccm) and Ar gas (250 sccm)
First high frequency power: 60 MHz, 300 W
Second high frequency power: 0 W In the experiment, the thickness of the deposit formed at each of 57 points on two diameters orthogonal to each other on the surface of the sample substrate is measured, and the deposition rate of the deposit is obtained based on the thickness and the processing time of the process ST2. Further, the average value (nm/min) and the non-uniformity (%) of the deposition rates at the 57 points are obtained. The non-uniformity is obtained according to the following formula.

$$(Max-Min)/(Average \times 2) \times 100$$

Here, "Max" denotes a maximum value of the deposition rates at the 57 points, "Min" denotes a minimum value of the deposition rates at the 57 points, and "Average" denotes an average value of the deposition rates at the 57 points. As a result of the experiment, the average value and the non-uniformity of the deposition rates at the 57 points are 21.2 nm/min and 2.0%, respectively.

In a comparative experiment, a deposit is formed on a sample substrate under the same conditions as in the above-described experiment except that no magnetic field is formed inside the chamber 10 by the electromagnet 60. In the comparative experiment, the average value (nm/min) and the non-uniformity (%) of the deposition rates at 57 points are obtained. As a result of the comparative experiment, the average value and the non-uniformity of the deposition rates at the 57 points are 21.4 nm/min and 5.0%, respectively.

As a result of the above-described experiment and comparative experiment, it is found out that according to the process ST2, it is possible to reduce the non-uniformity in the deposition rate of the deposit in the plane of the substrate. That is, it is found out that, by forming the magnetic field inside the chamber 10 using the electromagnet 60, it is possible to improve the in-plane uniformity in the deposition rate of the deposit on the substrate.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

EXPLANATION OF REFERENCE NUMERALS

According to the exemplary embodiment of the present disclosure, it is possible to improve the etching selectivity for the substrate and the in-plane uniformity in the etching.

We claim:
1. A method of selectively etching a first region of a substrate with respect to a second region of the substrate formed of a different material from the first region, the method comprising:
    etching the first region by plasma etching such that an upper surface of the first region is provided at a deeper position within the substrate than the second region;
    forming, after the etching of the first region, a deposit containing carbon on the substrate by forming plasma of a hydrocarbon gas inside a chamber of a plasma processing apparatus in which the substrate is placed; and further etching, after the forming of the plasma of the hydrocarbon gas, the first region by plasma etching, wherein in the forming of the deposit, magnetic field distribution in which a horizontal component on an edge side of the substrate is larger than a horizontal component on a center of the substrate is formed by an electromagnet.

2. The method of claim 1,
wherein the first region is formed of a silicon-containing material.

3. The method of claim 2,
wherein the second region is formed of a metal-containing material.

4. The method of claim 2,
wherein the first region is formed of silicon oxide, and the second region is formed of silicon nitride.

5. The method of claim 2,
wherein in the etching of the first region, plasma of a processing gas containing a fluorocarbon gas is formed inside the chamber in which the substrate is placed.

6. The method of claim 5,
wherein in the further etching of the first region, the plasma of the processing gas containing the fluorocarbon gas is formed inside the chamber in which the substrate is placed.

7. The method of claim 2,
wherein at least one of the etching of the first region or the further etching of the first region includes:
forming plasma of a processing gas containing a fluorocarbon gas inside the chamber in which the substrate is placed to form a deposit containing fluorocarbon on the substrate; and
forming plasma of a rare gas inside the chamber to etch the first region by supplying rare gas ions to the substrate to allow the fluorocarbon in the deposit formed on the substrate to react with the silicon-containing material.

8. The method of claim 1,
wherein the forming of the deposit and the further etching of the first region are repeated alternately.

9. A plasma processing apparatus configured to selectively etch a first region of a substrate with respect to a second region of the substrate formed of a different material from the first region, the plasma processing apparatus comprising:
a chamber;
a substrate supporting table, having a lower electrode, provided inside the chamber;
a gas supply configured to supply a gas into the chamber;
a high frequency power supply configured to generate a high frequency power to excite the gas inside the chamber into plasma;
an electromagnet configured to form a magnetic field in an internal space of the chamber;
a driving power supply configured to supply a current to the electromagnet; and
a controller configured to control the gas supply, the high frequency power supply and the driving power supply,
wherein the controller is configured to perform:
a first control including controlling the gas supply and the high frequency power supply to etch the first region by plasma etching such that an upper surface of the first region is provided at a deeper position within the substrate than the second region;
a second control including controlling the gas supply and the high frequency power supply to form plasma of a hydrocarbon gas in order to form a deposit containing carbon on the second region after the first region is etched; and
a third control including controlling the gas supply and the high frequency power supply to further etch the first region by plasma etching after the deposit is formed on the second region, and
wherein the second control includes controlling the driving power supply to form magnetic field distribution, in which a horizontal component on an edge side of the substrate is larger than a horizontal component on a center of the substrate, by the electromagnet while the plasma of the hydrocarbon gas is being formed.

10. The plasma processing apparatus of claim 9,
wherein the first region is formed of a silicon-containing material, and
the first control includes controlling the gas supply and the high frequency power supply to form plasma of a processing gas containing a fluorocarbon gas inside the chamber.

11. The plasma processing apparatus of claim 10,
wherein the third control includes controlling the gas supply and the high frequency power supply to form the plasma of the processing gas containing the fluorocarbon gas inside the chamber.

12. The plasma processing apparatus of claim 9,
wherein the first region is formed of a silicon-containing material, and
wherein at least one of the first control or the third control includes:
controlling the gas supply and the high frequency power supply to form plasma of a processing gas containing a fluorocarbon gas inside the chamber in order to form a deposit containing fluorocarbon on the substrate; and
controlling the gas supply and the high frequency power supply to form plasma of a rare gas inside the chamber in order to etch the first region by supplying rare gas ions to the substrate to allow the fluorocarbon in the deposit formed on the substrate to react with the silicon-containing material.

13. The plasma processing apparatus of claim 9,
wherein the controller alternately repeats the second control and the third control.

* * * * *